United States Patent [19]

Li et al.

[11] Patent Number: 5,519,362
[45] Date of Patent: May 21, 1996

[54] OPTICAL CURRENT CONTROLLED OSCILLATORS

[75] Inventors: Guifang Li, Penfield; Raymond K. Boncek, Fayetteville, both of N.Y.; Xiaolu Wang, Wilmington, Del.; David H. Sackett, Rochester, N.Y.

[73] Assignee: The United States of America as represented by the Secretary of the Air Force, Washington, D.C.

[21] Appl. No.: 518,406

[22] Filed: Aug. 23, 1995

[51] Int. Cl.⁶ .............................. H03C 3/00; H01S 3/10; H01S 3/13
[52] U.S. Cl. .............................................. 332/130; 372/38
[58] Field of Search ....................... 332/129, 130; 331/94.1, 1 R, 3, 9, 107 R, 175, 177 R, 186; 372/38

[56] References Cited

U.S. PATENT DOCUMENTS

| | | | |
|---|---|---|---|
| 4,961,197 | 10/1990 | Tanaka et al. | 372/45 |
| 5,022,036 | 6/1991 | Suyama et al. | 372/45 |
| 5,416,790 | 5/1995 | Yodoshi et al. | 372/46 |

Primary Examiner—David Mis
Attorney, Agent, or Firm—William G. Auton

[57] ABSTRACT

The observation of self-sustained pulsation and transient self-pulsation in laser diodes at 1300 nm is described with the effects of optoelectronic feedback on the pulsations. Transient self-pulsation has a lifetime of a few minutes with frequencies up to 7 GHz. The linewidth of self-pulsation is on the order of 0.5 GHz. With optoelectronic feedback, the transient self-pulsation can be stabilized and enhanced. The center frequency of feedback-sustained pulsation is dependent on the passband of the bandpass filter in the feedback loop. The linewidth of feedback-sustained pulsation is significantly reduced to about 20 kHz. The optical spectra of the laser diodes exhibit coherence collapse at weak optoelectronic feedback. The feedback sustained pulsation can be frequency modulated. Applications of the feedback-sustained pulsation include subcarrier multiplexing optical networks.

12 Claims, 3 Drawing Sheets

OPTICAL CURRENT CONTROLLED OSCILLATORS

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to oscillators, and more specifically the invention pertains to optical current controlled laser diode oscillators with optoelectronic feedback.

Self-sustained pulsation (SSP) is a dynamic process in laser diodes. It has been extensively studied both experimentally and theoretically. The majority of these previous experiments have been conducted in 780 nm laser diodes. SSP was first considered to be a nuisance and there were efforts aimed at reducing or eliminating SSP. It was realized later on that SSP laser diodes have low relative intensity noise (RIN) because of short coherence length which reduced the effects of optical feedback into the laser diodes. SSP laser diodes have also been proposed for use in all-optical clock recovery.

The present invention relates generally to oscillators, and more specifically the invention pertains to optical current controlled oscillators with optoelectronic feedback. An optical current controlled oscillator is an optical device that produces tunable microwave oscillations (subcarriers) which are already on an optical carrier.

The present invention exploits a nonlinear dynamic in semiconductor laser diodes, namely, transient self-intensity pulsation (TSP). Such semiconductor laser diodes when biased at other current levels exhibit self-sustained pulsation. Self-sustained pulsation (SSP) is a well-known dynamic process in laser diodes. It has been extensively studied both experimentally and theoretically. The majority of these previous experiments have been conducted in 780 nm semiconductor laser diodes. SSP was first considered to be a nuisance and there were efforts aimed at reducing or eliminating SSP. It was realized later on that SSP laser diodes have low relative intensity noise (RIN) because of short coherence length which reduced the effects of optical feedback into the laser diodes. SSP laser diodes have also been proposed for use in all-optical clock recovery. SSP laser diodes can be viewed as an optical current controlled oscillator.

SSP is not the only intensity oscillation, or intensity self-pulsation, dynamic in laser diodes. Self-pulsations in the semiconductor laser diodes fall into two categories, SSP and TSP. In many semiconductor laser diodes, intensity pulsations are predominantly transient in nature. SSP only occurs within a very small range of bias current. For example, a particular semiconductor laser diode exhibited self pulsation for bias currents between 17.0 and 32.0 mA with pulsation frequencies ranging from 3.5 GHz to 6.5 GHz. However, self-sustained pulsation only occurs for bias current values near 20 mA. Self-pulsation for other bias currents were transient, in which the intensity pulsation occurred as soon as the laser diode was turned on or turned to a different bias current. Transient self-pulsations typically only lasted for 1 to 3 minutes. When the bias current is above 20 mA, the frequency of TSP is higher than that of SSP. The present invention exploits TSP and therefore leads to optical current-controlled oscillators with frequencies higher than those which exploit SSP.

SUMMARY OF THE INVENTION

The present invention employs optoelectronic feedback to sustain and control self-pulsation in the semiconductor laser diode which otherwise is transient in nature.

One embodiment of the invention is an optical current-controlled oscillator based on optoelectronic feedback using a current source, a bias tee, a semiconductor laser diode, a photodetector, and a feedback loop. The current source establishes through the DC port of the bias tee an electrical feed signal to initially start the laser action in the semiconductor laser diode.

The semiconductor laser diode outputs a transient microwave signal on the optical carrier in the GHz range. The microwave signal on the optical carrier is converted into its equivalent electrical form by the photodetector element. The feedback loop amplifies the microwave signal electronically and subsequently feeds back into the semiconductor laser diode through the AC port of the bias tee. The level of optoelectronic feedback can be adjusted to yield stable microwave-frequency intensity pulsation, and to yield the desired linewidth of the microwave subcarrier.

The feedback-sustained pulsation can be frequency modulated by combining the modulating signal with the feedback signal using a microwave combiner. The feedback signal and the modulating signal both are applied to the semiconductor laser diode through the AC port of the bias tee.

It is an object of the present invention to provide a semiconductor laser diode-based system capable of generating microwave subcarriers that are already on an optical carrier.

It is another object of the present invention to provide a means for frequency modulating the aforementioned microwave subcarriers for lightwave communication networks.

The present invention includes a new design for optical current controlled laser diode oscillators with optoelectronic feedback. This optoelectronic feedback sustains and controls the self-pulsation on the laser diode which normally exhibit transient self-pulsation in the absence of optoelectronic feedback.

One embodiment of the invention is a laser diode oscillator that generates a feedback-sustained pulsation microwave subcarrier signal using:

a current source, an bias-tee circuit, a laser diode, a photodetector, and a feedback loop. The current source and bias-tee circuit provide an electrical dc feed signal to initially start the laser diodes.

The laser diode outputs a transient microwave signal on the optical carrier that can range between 2.0–7.0 GHz. The microwave signal on the optical carrier is converted into its equivalent electrical microwave carrier signal by the photodetector element. After amplification, the feedback loop uses a portion of the electrical microwave carrier as an input into the bias-tee circuit. This optoelectronic feedback sustains the pulsation of the laser diode.

Self-pulsations in the laser diodes (with the feedback being turned off) fall into two categories, SSP and TSP. The laser intensity pulsations observed on this experiment are predominately transient in nature. SSP only occurs within a very small range of bias current. The frequency range of the self-pulsation is between 2.0 GHz to 7.0 GHz. All laser diodes we have examined showed qualitatively similar pulsation behavior. For example, a particular laser exhibited self pulsation for bias currents between 17.0 and 32.0 mA with pulsation frequencies ranging from 3.5 GHz to 5.5 GHz. However, self-sustained pulsation only occurs for bias current values near 20 mA. On the feedback loop, the microwave oscillation signal is pre-amplified using a Miteq 18-GHz wideband low-noise amplifier. The amplified signal is split into two parts using an rf power splitter. Half of the rf power was used for monitoring the spectrum of the microwave oscillations using a HP 8594E microwave spectrum analyzer. The other half of the pre-amplified signal was fed into the laser diode through the ac port of the bias via a bandpass filter (BPF), another wideband amplifier and a microwave power combiner (COM). The other input port of the COM can be used for modulating signals.

It is an object of the present invention to provide a laser diode microwave carrier generator system.

It is another object of the present invention to provide any laser diode microwave carrier generator for subcarriers for lightwave communication networks in which analog (up to 1 GHz) and digital (up to 800 Mb/s) transmissions using SSP subcarriers are generated. Subcarrier-multiplexing (SCM) not only is compatible with wavelength-division multiplexing (WDM) but also can extend the capacity of WDM networks.

These objects together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENTS

The present invention is a new design for optical current controlled laser diode oscillators with optoelectronic feedback. This optoelectronic feedback sustains and controls the self-pulsation of the laser diode which normally exhibits transient self-pulsation in the absence of optoelectronic feedback. These optical current controlled oscillators can be used as subcarriers for lightwave communication networks. Both analog (up to 1 GHz) and digital (up to 800 Mb/s) transmission using SSP subcarriers have been reported. Subcarrier-multiplexing (SCM) not only is compatible with wavelength-division multiplexing (WDM) but also can extend the capacity of WDM networks. As a result, WDM-SCM networks are of particular interest for local area networks (LAN) where pure WDM may be able to provide a large number of nodes. It is therefore important to generate microwave subcarriers in laser diodes at wavelengths other than 780 nm. This letter describes SSP, transient self-pulsations (TSP), and the generation frequency modulation of feedback-sustained pulsations (FSP) in laser diodes at a range of 1300 nm wavelength, and frequencies of between 2.0–7.0 GHz.

Figure 1:
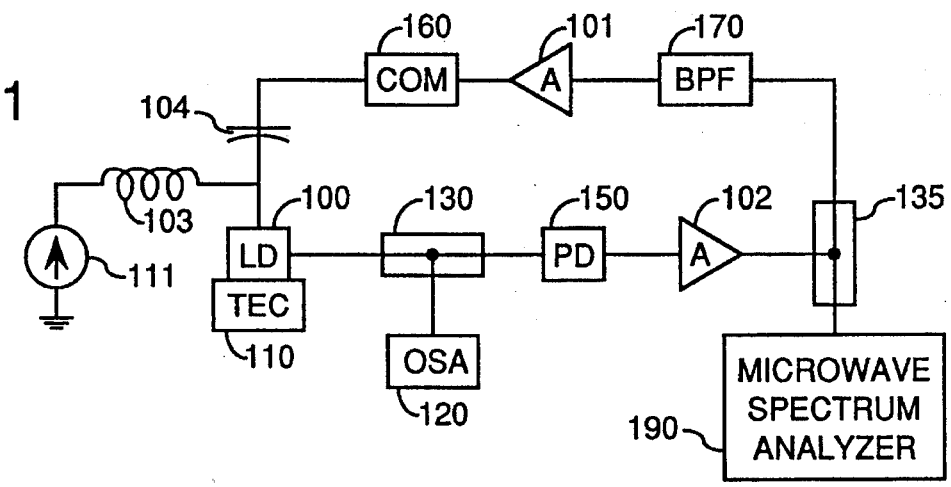
FIG. 1 is a block diagram that includes one embodiment of the invention.

The schematic of the present invention is shown in FIG. 1. The pulsations were observed in Mitsubishi Electric ML7011R In GaAsP single-mode (pigtailed) laser diodes (LD). The emission wavelength of these laser diodes was near 1300 nm with typical CW output powers of 5 mW. The laser diode was temperature stabilized to 20° C. using thermal electric cooler (TEC). The pigtailed fiber from the laser diode is fusion spliced to a 3 dB bi-directional fiber coupler. Half of the laser output is used for monitoring the optical spectrum using an Anritsu MS9001B1 optical spectrum analyzer (OSA). The other half of the laser output was used as a feedback into the laser diode through an optoelectronic feedback loop. The first component of the optoelectronic feedback loop is a photodetector (PD) which converts laser light pulsations into microwave oscillations. The microwave oscillation signal is pre-amplified using a Miteq 18-GHz wideband low-noise amplifier. The amplified signal is split into two parts using an rf power splitter. Half of the rf power was used for monitoring the spectrum of the microwave oscillations using a HP 8593E microwave spectrum analyzer. The other half of the pre-amplified signal was fed into the laser diode through the ac port of the bias tee via a bandpass filter (BPF), another wideband amplifier and a microwave power combiner (COM). The other input port of the COM was used for modulating signals.

Figure 2A:
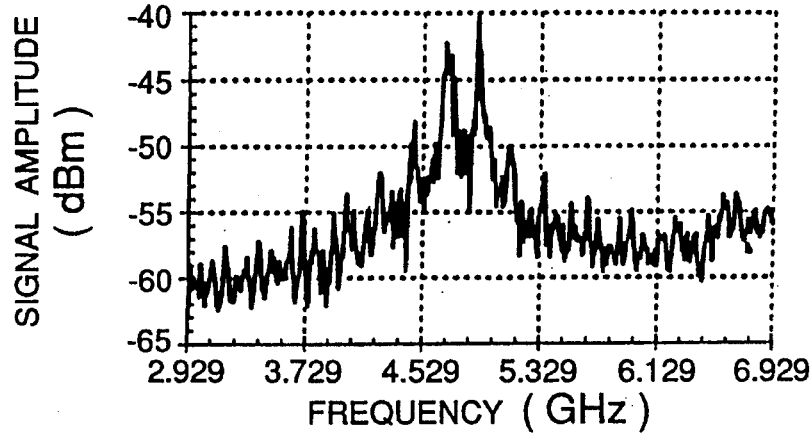
FIGS. 2a, 2b, 2c, 3a, 3b, 3c, 4a, 4b, and 5 are charts of the performance characteristics of the present invention.
Figure 2B:
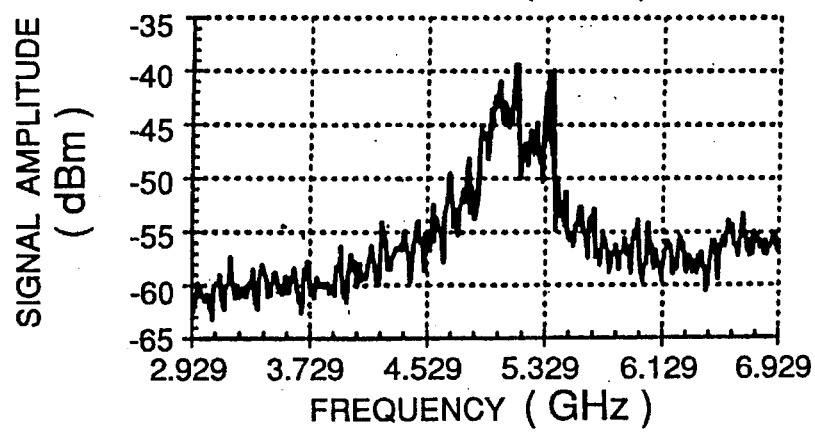
Figure 2C:
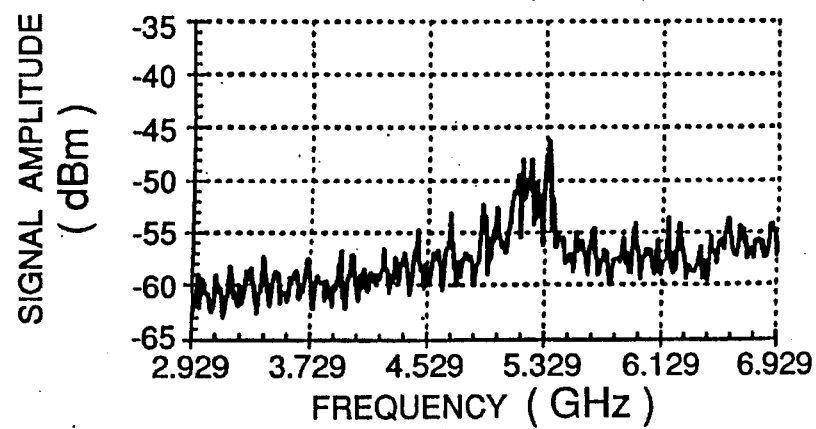

Self-pulsations in the laser diodes (with the feedback being turned off) fall into two categories, SSP and TSP. The laser intensity pulsations observed in this experiment are predominantly transient in nature. SSP only occurs within a very small range of bias current. The frequency range of the self-pulsation is between 2.0 GHZ to 7.0 GHz. All laser diodes we have examined showed qualitatively similar pulsation behavior. For example, a particular laser diode exhibited self pulsation for bias currents between 17.0 and 32.0 mA with pulsation frequencies ranging from 3.5 GHz to 6.5 GHz. However, self-sustained pulsation only occurs for bias current values near 20 mA. The microwave spectrum of the SSP at a bias current of 20 mA is shown in FIG. 2a. Self-pulsation for other bias current were transient, in which the intensity pulsation occurred as soon as the laser diode was turned on or turned to a different bias current. Transient self-pulsations typically only lasted for 1 to 3 minutes. FIG. 2b shows the microwave spectrum of the TSP immediately after the laser diode was turned on with a bias current of 21.0 mA. The linewidth of the self-pulsation is very broad and is on the order of 0.5 GHz. The microwave spectrum 35 seconds after the laser was turned on is shown in FIG. 2c. The magnitude of the self-pulsation reduced significantly in 35 seconds. The TSP disappeared in about 45 seconds.

Optoelectronic feedback has been used in previous work to reduce the linewidth of SSP. In this experiment, optoelectronic feedback was used to stabilize the TSP, to produce feedback-sustained pulsation (FSP). We found that optoelectronic feedback indeed stabilized the pulsation. Furthermore, the linewidth of FSP was also significantly reduced compared to that on the TSP. However, the center frequency of the FSP (nearly identical to that of the BPF) was mainly determined by the passband of the bandpass filter. The frequency of FSP can therefore be tuned by the BPF. In addition, the frequency of FSP with a fixed BPF can be fine tuned by laser diode bias current. This fine-tune range was about 45 MHz. Along with the generation of FSP with optoelectronic feedback where changes in the optical spectrum of the laser light.

Figure 3A:
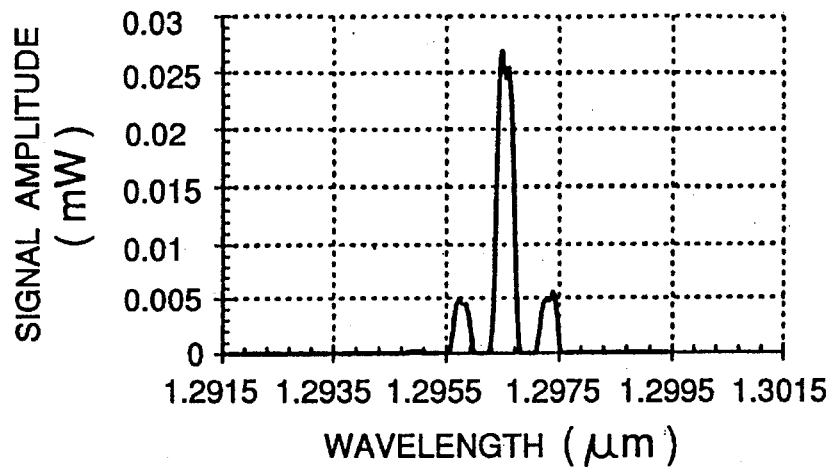
Figure 3B:
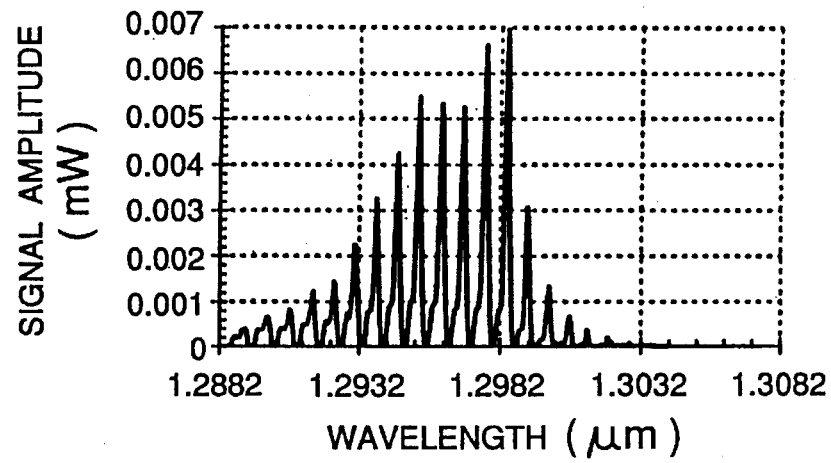
Figure 3C:
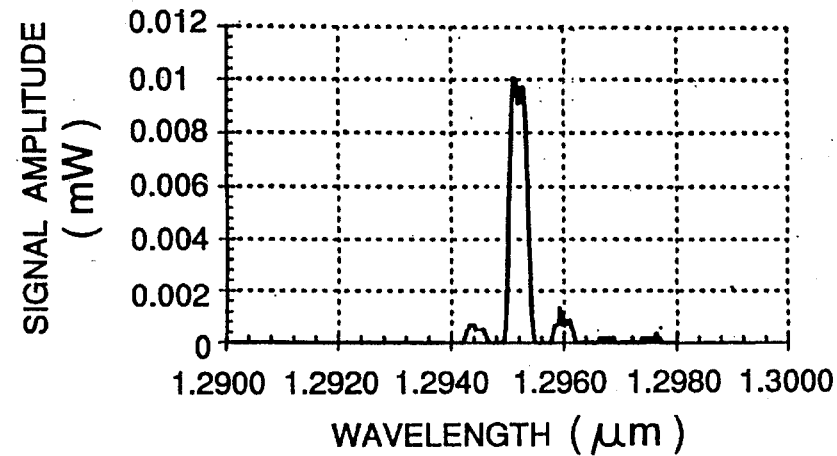

The present invention can use the optical spectra of the laser output with and without feedback. The spectrum of a free running laser diode is shown in FIG. 3a. There are not noticeable differences in the optical spectrum for TSP and SSP. There existed occasional mode hopping. In this particular spectrum the two side modes were about 7 dB down from the main mode. Almost all the optical power was contained in a wavelength span of about 2.0 nm. Optoelectronic feedback can significantly affect the optical spectrum of the laser diode output. In FIG. 3b, the optical spectrum of the laser output when the feedback was slightly above a threshold value for stable FSP. Now the wavelength span it about 15 nm. This is very similar to the coherent collapse observed in laser diode with external optical feedback. As the feedback was increased beyond a critical value, the optical spectrum, shown in FIG. 3c, switched into a form that more resembled that of the free running laser diode except for a few additional very weak side modes. It is worth mentioning that "strong" and "weak" feedback here are only qualitatively defined since the bias tee is not broadly matched to the laser diode and, as a result, it was not possible to easily estimate the extent of reflection of the feedback signal.

Figure 4A:
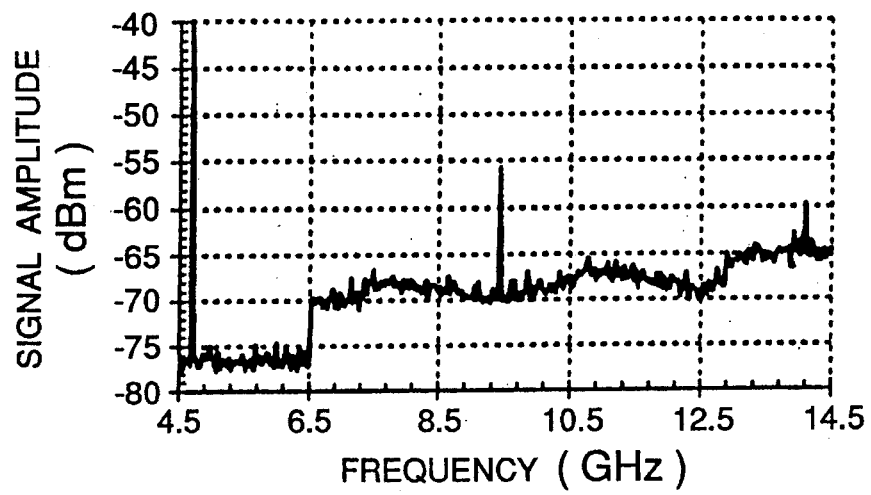
Figure 4B:
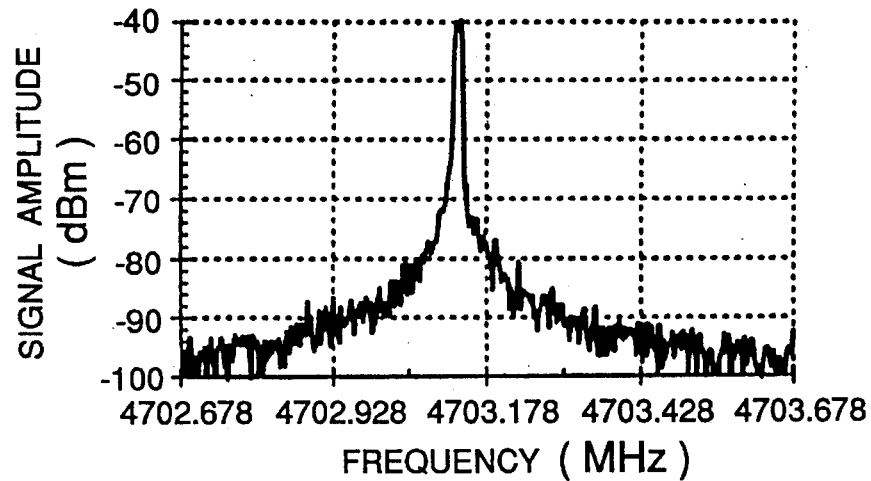

As mentioned earlier, the frequency of the FSP is predominantly determined by the passband of the bandpass filter. With a BPF of center frequency 4.68 GHz and 10% passband, the microwave spectrum of the FSP is shown in FIG. 4a. The fundamental frequency of the FSP is 4.70 GHz. High-order harmonics are also present in the FSP signal but are of lower amplitudes. The second harmonic is 20 dB below the fundamental harmonic. The linewidth of FSP is very narrow as can be seen in FIG. 4b which is a close-up look of the fundamental peak in the FSP signal.

Figure 5:
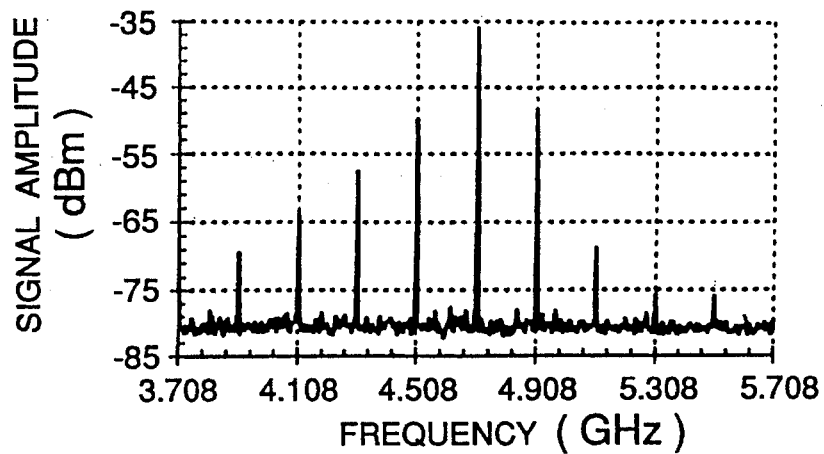

When a modulating signal is applied to the laser diodes, the frequency of FSP is modulated but then applied as the modulating signal. FIG. 5 shows the spectrum of the frequency modulated FSP signal. The carrier is the 4.70 GHz FSP and the modulating signal is a 200 MHz sinusoid. The uneven first sidebands signifies residual amplitude modulation. This was expected because the laser output power is also dependent on the bias current. Frequency modulation of FSP by signals of frequencies exceeding 500 MHz have been demonstrated in the experiment. This FM signal can be demodulated using standard FM demodulators such as the delay line demodulator. The present invention has achieved a signal-to-noise ratio of about 30 dB.

In conclusion, the invention makes possible the observation of self-sustained pulsation and transient self-pulsation in 1300 nm laser diodes. The mechanism for SSP is generally believed to be formation of periodic orbits due to Hopf bifurcation in the laser diode nonlinear dynamics. Transient self-pulsations has not been reported before. The origin of TSP is still under investigation. Although TSP is similar to the relaxation oscillation, the transient time of minutes for TSP is much longer than typical relaxation oscillation time. With optoelectronic feedback, TSP and SSP turn into stable FSP which can be used as high-frequency tunable microwave subcarriers at 1300 nm. For WDM-SCM application, it is important to provide sufficient optoelectronic feedback so that the optical spectrum of the laser output remains narrow. Even through FSP can be frequency modulated to very high frequencies (>500 MHz), the peak frequency deviation is within 45 MHz. Uses of the invention include subcarrier multiplexing of multiple channels in optical networks. The results include feedback sustained pulsation of a 1300 nm laser diode at 4.70 GHz center frequency. Frequency modulation of FSP by signals of frequencies exceeding 500 MHz have been demonstrated.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. An optical microwave oscillator for producing a microwave carrier signal and which comprises:
    a means for generating a sustained self-pulsation optical carrier signal which has a frequency range of between 2.0 GHz and 7.0 GHz; and
    a means for photoelectrically converting the sustained self-pulsation optical carrier signal of the generating means onto an equivalent electronic microwave carrier signal.

2. An optical microwave oscillator, as defined in claim 1, wherein said generating means comprises:
    an electrical power source which produces an electric driving signal to optical element;
    an electrical feedback circuit which outputs an electrical microwave signal in response to said electric driving signal from said electrical power source driving an optical element; and
    an optical element which receives and converts said electrical microwave signal from said electrical feedback circuit into said sustained self-pulsation optical carrier signal.

3. An optical microwave oscillator, as defined in claim 2, wherein said optical element comprises a laser diode.

4. An optical microwave oscillator, as defined in claim 1, wherein said converting means comprises a photodetector which converts said sustained self-pulsation optical carrier signal into said electronic microwave carrier signal.

5. An optical microwave oscillator, as defined in claim 2, wherein said converting means comprises a photodetector which converts said sustained self-pulsation optical carrier signal into said electronic microwave carrier signal.

6. An optical microwave oscillator, as defined in claim 3, wherein said converting means comprises a photodetector which converts said sustained self-pulsation optical carrier signal into said electronic microwave carrier signal.

7. An optical microwave modulator, as defined in claim 1, including a means for modulating said microwave carrier signal produced by said converting means.

8. An optical microwave modulator, as defined in claim 2, including a means for modulating said microwave carrier signal produced by said converting means.

9. An optical microwave modulator, as defined in claim 3, including a means for modulating said microwave carrier signal produced by said converting means.

10. An optical microwave modulator, as defined in claim 4, including a means for modulating said microwave carrier signal produced by said converting means.

11. An optical microwave modulator, as defined in claim 5, including a means for modulating said microwave carrier signal produced by said converting means.

12. An optical microwave modulator, as defined in claim 6, including a means for modulating said microwave carrier signal produced by said converting means.

* * * * *